Nov. 10, 1970 M. P. LANGENDORF ET AL 3,539,829

TONE DETECTION CIRCUIT

Filed June 17, 1968

INVENTORS
MATTHEW P. LANGENDORF
WILLIAM H. SEBASTIAN

BY John W Girvin, Jr.
ATTORNEY

United States Patent Office 3,539,829

Patented Nov. 10, 1970

3,539,829

TONE DETECTION CIRCUIT

Matthew P. Langendorf and William H. Sebastian, Lexington, Ky., assignors to International Business Machines Corporation, Armonk, N.Y., a corporation of New York Filed July 17, 1968, Ser. No. 737,497
Int. Cl. H03k *1/16*
U.S. Cl. 307—233 6 Claims

ABSTRACT OF THE DISCLOSURE

A circuit for detecting predetermined tone or signal frequency combinations comprising a plurality of similar active resonant filters connected as bandpass stages and tuned stages and integrating circuits responsive to the output signals of the tuned stages. Each resonant filter consists of an amplifier with a phase shift feedback network which provides a positive feedback signal at the select frequency. The input signal is applied to the emitter junction which isolates the frequency selection components from the input impedance. An unbypassed emitter dampens the amplifier and prevents oscillation. Proper sizing of this resistor allows the amplifier to be utilized as a bandpass filter or as a sharply tuned filter.

CROSS REFERENCES TO RELATED APPLICATIONS

The following applications are all assigned to the same assignee as the present application:

U.S. patent application Ser. No. 737,762, entitled "Tone Elimination System," Matthew P. Langendorf, et al., inventors, filed June 17, 1968, concurrently herewith.

U.S. patent application Ser. No. 737,643, entitled "Tone Actuated Dictation Systems," Thomas E. Dooley, et al., inventors, filed June 17, 1968, concurrently herewith.

U.S. patent application Ser. No. 737,642, entitled "Tone Actuated Dictation Systems with Voice Buffer Option," Matthew P. Langendorf, et al., inventors, filed June 17, 1968, concurrently herewith.

BRIEF BACKGROUND OF THE INVENTION

Field of the invention

This invention relates to a tone detection circuit and, more particularly, to an active resonant filter network comprising a plurality of damped phase shift oscillators and integrators responsive to the output signals of the damped oscillators for providing signals indicative of the presence of an input signal having a predetermined frequency and time duration at the input of an associated oscillator circuit.

Description of the prior art

The present tone detection circuit is designed for accurately detecting a signal having predetermined frequency components which are present for a peredetermined time interval. Such a circuit can be utilized in conjunction with a tone actuated dication system as described in the aforereferenced copending applications of Dooley et al. and Langendorf et al. In such an environment, it is necessary that the tone detection circuit be tuned to provide a response for a plurality of signal frequencies which may be simultaneously present, and, further, separate the multiple frequency response signals into each signal component. Additionally, in such an environment, low frequency signal tones must be recognized while maintaining component size and cost at a minimum.

The prior art detection circuits fall into two general categories: active filter networks and passive filter networks. Passive filter networks are capable of providing a sharp frequency response when precisely tuned to the desired frequency, but have the inherent disadvantage of requiring large and bulky inductors for low frequency applications. Prior art active filters either utilize negative feedback at all frequencies other than the select frequency, or utilize an operational amplifier in conjunction with a passive feedback network. Those filters utilizing negative feedback have low Q's associated therewith since the circuit Q is determined solely by the passive RC feedback network. An example of such a prior art device is a twin T passive network coupled between the output terminal of an active device. Those active filters utilizing operational amplifiers require two or more active elements thereby increasing circuit cost. Additionally, the input signal impedance affects the operating frequency of the passive network which is connected to the input terminal and, therefore, must be precisely controlled, thus complicating design.

SUMMARY

In order to overcome the above problems of the prior art and to provide a low cost miniaturized tone detection circuit for detecting multiple low frequency tones, the tone detection circuit of the present invention comprises a plurality of similar active filters, each of which achieve a high Q without being affected by input signal impedance characteristics. Each such active filter comprises a damped amplifier with a phase shift feedback network which provides positive feedback at a selected frequency thereby providing an output response similar to a resonant circuit. The output response is utilized by an integrating circuit which provides a logical signal output whenever the output signal of the amplifier exceeds a predetermined and settable signal level for a predetermined time duration. Since the output signal of the amplifier must exceed a predetermined and settable level, the integrator circuit thus controls the bandwidth response of the filter. The phase shift feedback network of the amplifier consists of three R-C networks coupled from the collector electrode of the amplifier transistor to the base electrode. This network is tuned to shift signals of the selected or resonant frequency by 180°. Since the feedback network comprises resistors and capacitive reactance, no expensive and bulky inductors are necessitated. The input signal is applied to the emitter electrode of the amplifier transistor and thus input impedance variations have no effect upon the frequency selection of the device. The emitter circuit of the amplifier has associated therewith a dampening resistor which prevents the amplifier from oscillating at the resonant frequency. Proper sizing of this resistor shapes the frequency response of the amplifier thereby enabling it to be utilized as a bandpass stage of as a finely tuned stage.

The foregoing and other features and advantages of the invention will be apparent from the following more particular description of the preferred embodiment of the invention as illustrated in the accompanying drawings.

Figures 1, 2:
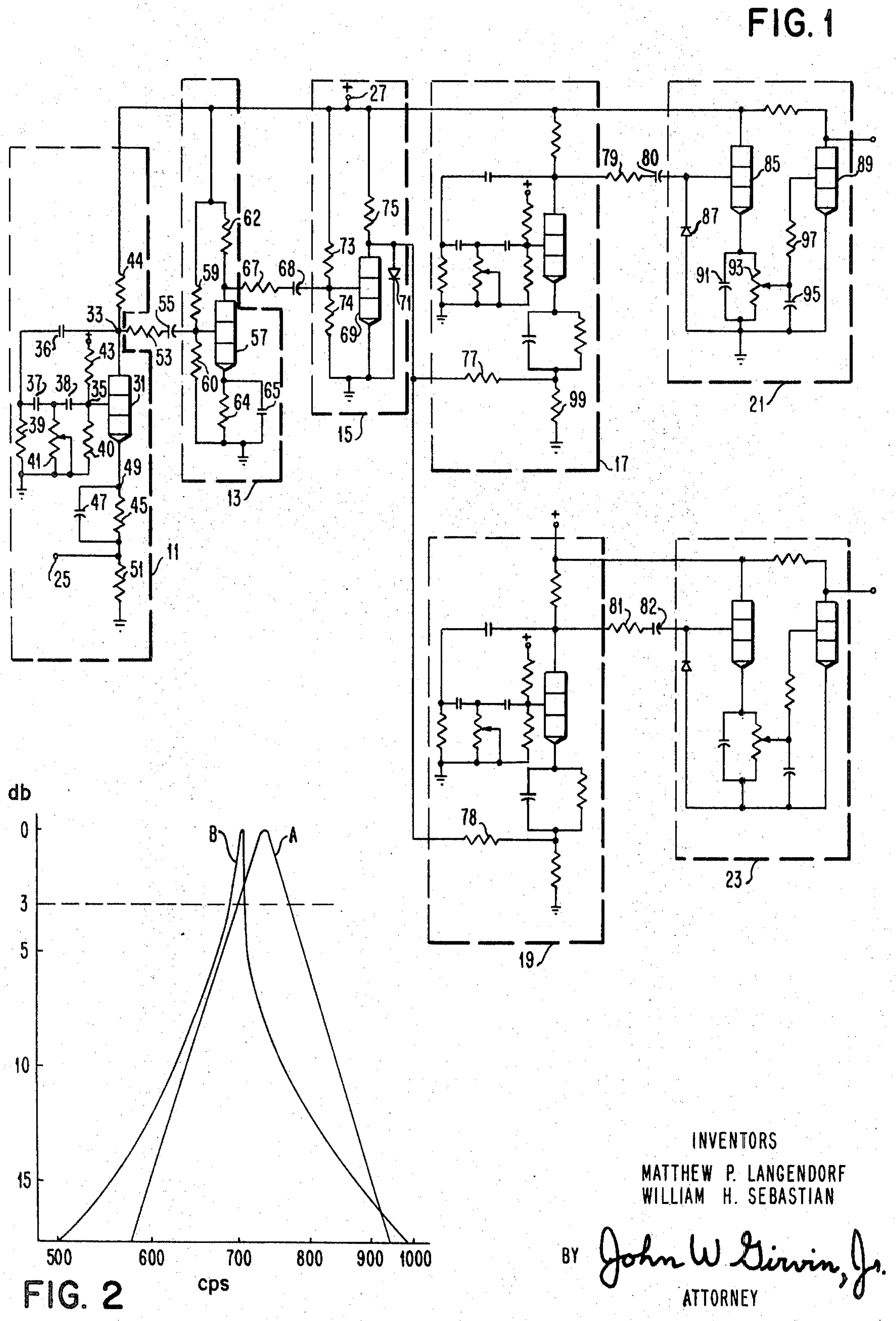
FIG. 1 is a schematic circuit diagram of a tone detection circuit according to the invention.
FIG. 2 is a waveform representation of the output signal response of the filter stages 13 and 17 of the circuit of FIG. 1.

Referring now to FIG. 1, a schematic circuit diagram of the tone detection circuit according to the present invention is depicted. This circuit comprises a bandpass filter stage 11, an amplifier stage 13, a limitor stage 15, two tuned filter stages 17 and 19, two integrator stages 21 and 23, and various interstage coupling devices. The bandpass filter stage 11 and the tuned filter stages 17 and 19 each consist of an amplifier with a phase shift feedback network which gives positive feedback at a select frequency. An input signal is applied to a terminal 25 of the bandpass filter stage 11 whereupon it is filtered and thence transmitted to the amplifier stage 13 for amplification and then to the limitor stage 15 which limits the signal level. Thereafter, the signal is sent to the tuned filter stages 17 and 19 which are sharply tuned to the frequencies to be detected. The output signals of the tuned filter stages are integrated by the integrator stages 21 and 23, respectively, which provide an output signal whenever an input signal is applied thereto of a predetermined level and time duration. This output signal may thereafter be utilized, for example, by a tone actuated recording system. Two sources of D.C. potential are utilized for the tone detection circuit: a positive source applied to the terminal 27, and ground.

The bandpass filter stage 11 comprises a transistor 31 whose collector electrode 33 is coupled to its base electrode 35 through the capacitors 36, 37 and 38 and the resistors 39 and 40 and the variable resistor 41. Each capacitor resistor combination (e.g., capacitor 36 and resistor 39) provides a 60° phase shift of the signal at the select frequency which appears at the collector electrode whereby the signal at the select frequency is shifted 180° before being applied to the base electrode 35. The variable resistor 41 is varied to tune the feedback network to the select frequency. A resistor 43 provides a proper bias level to the base of the transistor 31. Resistor 44 is connected between supply terminal 27 and the collector electrode 33 and serves as a load resistor. A resistor 45 and a capacitor 47 provide proper D.C. bias to the emitter electrode 49, the capacitor 47 providing an A.C. bypass to resistor 45. An emitter resistor 51 is of sufficient magnitude to prevent the amplifier from oscillating at all frequencies including the select frequency of the amplifier. Thus, even when an input signal having the select frequency of the phase shift feedback network is applied to the input terminal 25, the output signal of the bandpass filter stage 11 does not oscillate. However, it is to be noted that signals having frequencies outside the select frequency range of the bandpass filter stage 11 are sharply attenuated, while those signals having frequencies within the range are attenuated to a lesser degree or have a small degree of gain as they appear at the collector electrode 33.

The output signal of the bandpass filter stage 11 is supplied to an isolating resistor 53 and a coupling capacitor 55, and thence to the base electrode of the transistor 57 of the amplifier stage 13. The transistor 57 operates as a class A amplifier and is biased into operation by a pair of D.C. biasing resistors 59 and 60 which are coupled to the base electrode and to the terminal 27 and ground, respectively. Additionally, the collector electrode of the transistor 57 is coupled through a load resistor 62 to terminal 27. The emitter electrode of the transistor 57 is biased by a resistor 64, the capacitor 65 providing an A.C. bypass. The output of the amplifier stage 13 is taken from the collector electrode of the transistor 57 and applied to an isolating resistor 67 and a coupling capacitor 68, and thence applied to the base electrode of the transistor 69 of the limitor stage 15.

The limitor stage 15 limits the sine wave input from the amplifier stage 13 and produces a square wave output. The limitor stage consists of a transistor 69 which operates as a class A amplifier and a diode 71 which clips the peak voltage at the collector electrode of transistor 69 to thereby provide a square wave output. Biasing resistors 73 and 74 are connected between the terminal 27 and ground and to the base electrode of transistor 69. A load resistor 75 is connected to the collector electrode of the transistor 69. The output signal of the limitor stage 15 is applied to the tuned filter stages 17 and 19 by the coupling resistors 77 and 78. The tuned filter stages 17 and 19 are identical to the bandpass filter stage 11, except that they are more precisely tuned to the select frequencies.

This tuning is achieved by properly sizing the emitter resistor. Additionally, the square wave input causes a sharper response by the tuned filter stages. The sinusoidal output signals of the tuned filter stages 17 and 19 are applied, respectively, to the isolating resistor coupling capacitor combinations 79, 80 and 81, 82, and thence to their respective integrator stages 21 and 23.

The integrator stage 21 provides a logical signal output indicative of detecting the desired tone whenever the output signal of the tuned filter stage 17 exceeds a predetermined level for a predetermined period of time. Since the integrator stage sets the detection level of the output signal of the tuned filter stage, it determines the acceptable frequency variation or bandwidth of the tone detection circuit. The integrator stage 21 comprises a transistor 85, the base electrode of which is responsive to the sinusoidal output signal of the tuned filter stage 17 and a diode 87 which is also responsive to the same output signal. The transistor 85 conducts during the positive portion of the sinusoidal output signal provided it is of sufficient magnitude to overcome the threshold voltage of the transistor and the diode 87 provides a bypass for the negative portion of the sinusoidal output signal to ground.

The transistor 85 is connected in an emitter follower configuration to drive the transistor 89 into conduction. The transistor 89 operates as a logical switch and conducts whenever the signal applied to its base electrode reaches a threshold level. A capacitor 91, a variable resistor 93, a capacitor 95 and a resistor 97 determine the time period during which the sinusoidal output signal of the tuned filter stage 17 must be applied to the base electrode of the transistor 85 before the base electrode of the transistor 89 reaches its threshold level. Additionally, the setting of the variable resistor 93 determines the range of frequencies which the circuit will respond to. The output signal taken from the collector electrode of the transistor 89 is at an up level until the tuned filter stage 17 has received the correct frequency input for the selected period of time. Thereafter, the transistor 89 switches and its output level goes down and remains down for a predetermined time after the signal is removed from the base electrode of the transistor 85 as determined by resistor 93 and capacitor 91. The integrator stage 23 functions in an identical manner to the integrator stage 21.

OPERATION

In operation, an input signal containing random frequency patterns which may or may not include the signals to be detected is applied to the input terminal 25 of the bandpass filter stage 11. The output signal of the bandpass filter stage 11 is taken at the collector electrode 33 of the transistor 31. This output signal is fed back through a phase shift network consisting of the capacitors 36–38 and the resistors 39–41. The phase shift network shifts the phase of signals within the desired frequency range approximately 180° while shifting the phase of those signals having frequencies outside the desired range by greater or lesser extent. Those signals shifted 180° are further amplified by the action of the transistor 31, while those signals shifted by a greater or lesser extent are sharply attenuated. Since the emitter resistor 51 is large, the gain of the transistor circuit is not sufficient to effect oscillation, even at the select or center frequency.

The output signal of the bandpass filter stage 11 is applied to the amplifier stage 13 whereupon it is linearly amplified. The amplified signal is then limited by the limiter stage 15 which limits the amplitude of all signals applied thereto to a predetermined level. This action maintains a constant output signal regardless of different input signal amplitudes within the bandpass range of the bandpass filter stage 11 thereby eliminating the necessity of automatic gain control circuitry. The output signal of the limiter stage is applied to the tuned filter stages 17 and 19, each of which are more sharply tuned than the bandpass stage 11 to respond to signals having specific frequency components within the frequency passed by the bandpass stage. Additionally, the response of the tuned filter stages 17 and 19 are sharper than the bandpass stage because of the square wave input.

Those signals lying within the center frequency range of the tuned filter stage, as well as the attenuated signals just outside of the center frequency range, are applied to the transistor 85 and diode 87 of the integrator stage 21. The diode 87 conducts during the negative half cycle of its input signal and the transistor 85 is turned on during the positive half cycle provided that the input signal is above the threshold level of the transistor. The capacitors 91 and 95 are charged during each positive half cycle of the input signal which turns on the transistor 85 and are discharged through the resistor 93 during negative half cycles. The time constant of this RC network prevents the capacitors from completely discharging during the negative half cycle thereby integrating the input signal. When the capacitors 91 and 95 are sufficiently charged to a predetermined level, dependent upon the setting of the variable resistor 93, the transistor 89 switches from an up level to a down level thereby indicating that the desired frequency tone has been present for the desired time period. The tuned filter stage 19 and its associated integrator stage 23 operate in an identical manner to that discussed above with respect to the tuned filter stage 17, except that it is tuned for a different signal frequency selection.

The bandpass filter stage 11 is tunable to a center frequency of 735 c.p.s. when the values of circuit components as indicated in the following table are used:

| | | |
|---|---|---|
| Capacitor **36** | microfarads | .01 |
| Capacitor **37** | do | .01 |
| Capacitor **38** | do | .01 |
| Resistor **39** | ohms | 6,980 |
| Variable resistor **40** | do | 10,200 |
| Resistor **41** | do | 10,000 |
| Resistor **43** | do | 22,000 |
| Resistor **44** | do | 8,200 |
| Resistor **45** | do | 4,700 |
| Capacitor **47** | microfarads | 100 |
| Resistor **51** | ohms | 82 |
| Capacitor **55** | microfarad | 1 |
| Terminal **27** voltage | volts | 16 |

Tuned filter stage 17 is tunable to a center frequency of 697 c.p.s. with the identical circuit components, except for the emitter resistor 99 which has a value of 100 ohms. By changing the size of the emitter resistor, the tuned filter stage achieves a much sharper response. If the input to this stage were sinusoidal as is the input to the bandpass filter stage 11, the emitter resistor would be made smaller, thereby reducing its negative feedback effect and sharpening its response.

Referring now to FIG. 2, the output signal response of the bandpass filter stage 11 and the output signal response of the tuned filter stage 17 is depicted for the component values listed in the table above. The response of the bandpass filter stage 11 is shown in waveform A to have a center frequency at 735 c.p.s., while the response of the tuned filter stage 17 is shown in waveform B to have a center frequency at 697 c.p.s. Waveform B is down approximately three decibels within 18 cycles of the center frequency, while waveform A is down three decibels within 35 cycles of the center frequency. This shows that the bandpass filter stage 11 passes a much wider range of input signals than does the tuned stage. Thus, the bandpass stage not only passes signal having a frequency of 697 c.p.s., but also those, for example, having a frequency of 770 c.p.s. for which the other tuned filter stage 19 could be tuned.

In the circuit which has been described, the output signals are supplied by the integrator stages 21 and 23 whenever an input signal of a predetermined level and duration is present having frequency components corresponding to the center frequencies of the tuned filter stages 17 and 19. It is, of course, recognized by those skilled in the art that if it were desirous to detect more than two tones, several bandpass filters could be utilized in conjunction with additional tuned filter stages. Conversely, one tuned filter stage would be sufficient to detect a single desired frequency.

While the invention has been particularly shown and described with reference to the preferred embodiment thereof, it should be understood by those skilled in the art that the foregoing and other changes in form and detail may be made therein without departing from the scope of the invention.

What is claimed is:

1. An active resonant filter for filtering all signals except those within a selected frequency range comprising:
- a first transistor having base, emitter, and collector electrodes;
- a first source of supply voltage;
- a second source of supply voltage, one of said sources having a positive potential relative to the other source;
- a collector resistor connected between the collector electrode of the transistor and the first voltage source;
- a voltage phase shifting network coupled between the collector elcetrode and the base electrode of the transistor for shifting signals within the selected frequency range appearing at the collector electrode by approximately 180°, said phase shitfing network comprising resistive impedance and capacitive impedance;
- an unbypassed emitter resistor connected between the second voltage source and the emitter electrode of the transistor, said emitter resistor limiting the gain of the transistor device to prevent oscillation within the selected frequency range;
- an input signal terminal connected between the emitter electrode and the emitter resistor for supplying the signals to be filtered;
- integrating means for integrating the signal appearing at the collector electrode and for supplying an output signal when a signal within the selected frequency range has appeared at the collector electrode for a predetermined period of time.

2. The active resonant filter set forth in claim 1 wherein the phase shifting network comprises three resistive-capacitive combinations, each of said combinations shifting said signals of the selected frequency range by approximately 60°.

3. The active resonant filter set forth in claim 1 wherein said integrating means comprises:
- a second transistor having base, emitter and collector electrodes connected as an emitter follower and responsive to the output signal appearing at the collector electrode of the first transistor;
- a capacitor connected between the emitter electrode of the second transistor and the second voltage source;
- a resistor connected between the emitter electrode of the second transistor and the second voltage source in parallel with said capacitor, the time constant of said resistor and capacitor determining the predetermined period of time;
- a third transistor having base emitter and collector electrodes, the base electrode of which is responsive to the signal appearing between the emitter electrode of the second transistor and the second voltage source, said third transistor conducting whenever said signal reaches the threshold level of the transistor.

4. A tone detection circuit comprising:
- an active resonant bandpass filter for filtering all signals except those within a selected bandpass frequency range, said bandpass filter consisting of
  - a first transistor having base, emitter and collector electrodes;
  - a voltage phase shifting network coupled between the collector electrode and the base electrode of the transistor for shifting signals of the selected bandpass frequency range appearing at the collector electrode by approximately 180°;

an unbypassed emitter resistor for limiting the gain of the transistor to prevent oscillation, said emitter resistor providing a large degree of negative feedback to insure that all signals within the selected bandpass frequency range are not greatly attenuated;

an input signal terminal connected between the emitter electrode and the emitter resistor for supplying the signals to be filtered;

a signal limitor responsive to the output signal of the active resonant filter at the collector electrode for providing a limited square wave output;

an active resonant tuned filter for filtering all signals except those within a selected tuned frequency range, said tuned filter consisting of a second transistor having base, emitter and collector electrodes;

a voltage phase shifting network coupled between the collector electrode and the base electrode of the second transistor for shifting signals of the tuned frequency range appearing at the collector electrode by approximately 180°, an unbypassed emitter resistor connected to the emitter electrode of the second transistor for limiting the gain of the second transistor to prevent oscillation, said emitter resistor being of sufficiently small value to produce a minimum degree of negative feedback thereby effecting a sharp response by the tuned filter;

an input signal terminal responsive to the square wave output signal of the signal limitor connected between the emitter electrode and the emitter resistor for supplying the signals to be filtered;

integrating means for integrating the signal appearing at the collector electrode of the second transistor and for supplying an output signal when a signal within the selected tuned frequency range has appeared at said collector electrode for a predetermined period of time.

5. The tone detection circuit set forth in claim 4 wherein the phase shifting network of the active resonant bandpass filter and the phase shifting network of the active resonant tuned filter each comprise three resistive capacitive combinations, each of said combinations shifting signals within the selected frequency range by approximately 60°.

6. The tone detection circuit set forth in claim 5 wherein the integrating means consists of a third transistor having base, emitter and collector electrodes connected as an emitter follower and responsive to the output signal appearing at the collector electrode of the second transistor;

a capacitor connected between the emitter electrode of the third transistor and a voltage source;

a resistor connected between the emitter electrode of the third transistor and the second voltage source in parallel with said capacitor, the time constant of said resistor and capacitor determining the predetermined period of time;

a fourth transistor having base emitter and collector electrodes, the base electrode of which is responsive to the signal appearing between the smitter electrode of the third transistor and the second voltage source, said fourth transistor conducting whenever said signal reaches the threshold level of the transistor.

References Cited

UNITED STATES PATENTS

| | | | |
|---|---|---|---|
| 3,075,151 | 1/1963 | Murray | 330—21 X |
| 3,107,331 | 10/1963 | Barditch et al. | 330—26 X |
| 3,405,234 | 10/1968 | West | 307—233 X |

OTHER REFERENCES

Delpech, "Simple Circuit Tunes Audio Amplifier." Electronics, Mar. 22, 1965, pp. 84–85.

JOHN KOMINSKI, Primary Examiner

J. B. MULLINS, Assistant Examiner

U.S. Cl. X.R.

307—295; 328—138, 167; 330—31